United States Patent
Ha et al.

(10) Patent No.: US 8,629,062 B2
(45) Date of Patent: Jan. 14, 2014

(54) METHOD FOR FORMING TUNGSTEN FILM HAVING LOW RESISTIVITY AND GOOD SURFACE ROUGHNESS AND METHOD FOR FORMING WIRING OF SEMICONDUCTOR DEVICE USING THE SAME

(75) Inventors: Ga Young Ha, Gyeongsangnam-do (KR); Jun Ki Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 922 days.

(21) Appl. No.: 11/965,179

(22) Filed: Dec. 27, 2007

(65) Prior Publication Data
US 2009/0142925 A1 Jun. 4, 2009

(30) Foreign Application Priority Data
Nov. 30, 2007 (KR) .................. 10-2007-0123756

(51) Int. Cl.
*H01L 21/44* (2006.01)
(52) U.S. Cl.
USPC .................. 438/685; 438/680; 257/E21.476
(58) Field of Classification Search
USPC ........... 438/586, 656, 685, 680; 257/E21.476
See application file for complete search history.

(56) References Cited

U.S. PATENT DOCUMENTS

| | | | |
|---|---|---|---|
| 6,107,200 A | 8/2000 | Takagi et al. | |
| 6,162,715 A | 12/2000 | Mak et al. | |
| 6,284,636 B1 | 9/2001 | Hossain et al. | |
| 6,340,629 B1 | 1/2002 | Yeo et al. | |
| 2003/0013300 A1 | 1/2003 | Byun | |
| 2003/0153181 A1* | 8/2003 | Yoon et al. ................ | 438/685 |
| 2005/0032364 A1 | 2/2005 | Okubo et al. | |
| 2005/0211163 A1* | 9/2005 | Li et al. ..................... | 118/308 |
| 2006/0128150 A1* | 6/2006 | Gandikota et al. ........ | 438/681 |
| 2008/0111167 A1* | 5/2008 | Yamaguchi ............... | 257/288 |
| 2011/0187000 A1* | 8/2011 | West ......................... | 257/751 |

FOREIGN PATENT DOCUMENTS

| | | |
|---|---|---|
| EP | 0 908 934 B1 | 12/2008 |
| KR | 10-2000-0003480 * | 1/2000 |
| KR | 1020000003480 A | 1/2000 |
| KR | 1020010059996 A | 7/2001 |
| KR | 1020010070961 A | 7/2001 |
| KR | 1020020001381 A | 1/2002 |
| KR | 10-2006-0058583 * | 5/2006 |

(Continued)

OTHER PUBLICATIONS

Yong Soo Kim, et al; "Low Resistive Tungsten Dual Polymetal Gate Process for High Speed and High Density Memory Devices", 37th European Solid State Device Research Conference, 2007, ESSDERC 2007, Sep. 11-13, 2007, pp. 259-262.

*Primary Examiner* — Kimberly Rizkallah
*Assistant Examiner* — Duy T Nguyen
(74) *Attorney, Agent, or Firm* — Ladas & Parry LLP

(57) ABSTRACT

A method for forming a tungsten film includes forming a tungsten nucleation layer having an amorphous-phase or a β-phase over a semiconductor substrate. A first tungsten layer having a crystalline α-phase is then formed over the tungsten nucleation layer to form a low resistivity tungsten film. A second tungsten layer is formed over the first tungsten layer by a physical vapor deposition process, and the second tungsten layer has a large grain size similar to that of the low resistivity tungsten film. The tungsten film has both good surface roughness and low resistivity, thus enhancing the production yield and reliability of a semiconductor device.

13 Claims, 4 Drawing Sheets

(56) References Cited

FOREIGN PATENT DOCUMENTS

| | | | |
|---|---|---|---|
| KR | 1020060058583 A | 5/2006 | |
| KR | 1020080029672 A | 4/2008 | |
| WO | 00/04574 A1 | 1/2000 | |
| WO | 01/54177 A1 | 7/2001 | |

* cited by examiner

METHOD FOR FORMING TUNGSTEN FILM HAVING LOW RESISTIVITY AND GOOD SURFACE ROUGHNESS AND METHOD FOR FORMING WIRING OF SEMICONDUCTOR DEVICE USING THE SAME

CROSS-REFERENCE TO RELATED APPLICATIONS

The present application claims priority to Korean patent application number 10-2007-0123756 filed on Nov. 30, 2007, which is incorporated herein by reference in its entirety.

BACKGROUND OF THE INVENTION

The present invention relates generally to a method for manufacturing a semiconductor device, and more particularly, to a method for forming a tungsten film with low resistivity and low surface roughness and a method for forming the wiring of a semiconductor device using the same.

A wiring in a semiconductor device, e.g. a gate, is formed mainly of a polysilicon film. The polysilicon film is used because it sufficiently satisfies the physical properties required for a gate in a semiconductor device, such as a high melting point, ease of forming a thin film, ease of patterning a line, stability in an oxidation atmosphere, and formation of a planarized surface. Additionally, in a MOSFET device, a low gate resistance can be realized by doping a dopant such as phosphorous (P), arsenic (As), or boron (B) into the polysilicon gate.

However, as the level of integration in a semiconductor device increases, the line width of the gate, the thickness of a gate insulation film, and a junction depth are reduced. These reductions make it difficult to realize the required low resistance in the gate made of polysilicon.

Accordingly, it has become necessary to develop a novel gate material that can replace the polysilicon film. In the early stages of development, a metal silicide film was employed as a gate material, and a polycide gate formed of a stacked structure of the polysilicon film and the metal silicide film was developed. However, the polycide gate also reached limitations in realizing the low resistance required in a semiconductor device of sub-100 nm technology.

Therefore, recent developments have gone in the direction of a metal gate formed of a stacked structure of the polysilicon film and a metal film. The metal gate does not use a dopant, and thus it is possible to solve the problems generated in the polycide gate. Also, the metal used in the metal film has a work function value corresponding to the mid band-gap of silicon, making it possible to apply the metal film as a single gate that can be used simultaneously in both a NMOS area and a PMOS area. For example, a tungsten gate that employs tungsten is being actively studied.

However, a problem still exists when using tungsten as the gate material, in that an increase in gate resistance has been caused by: a decrease in a gate critical dimension; a line width effect; and an increase in the tungsten resistivity. Accordingly, studies have been conducted to solve the problem of the increased gate resistance resulting from the increase in the tungsten resistivity. Many unsuccessful attempts were made to solve the problem of increased gate resistance with any type of satisfaction, until now.

SUMMARY OF THE INVENTION

Embodiments of the present invention are directed to a method for forming a tungsten film, which allows the tungsten film to have a low resistivity.

Additionally, embodiments of the present invention are directed to a method for forming a tungsten film, which allows the tungsten film to have a low resistivity and also does not cause any defects in follow-up processes.

In addition, embodiments of the present invention are directed to a method of forming the wiring of a semiconductor device that ensures the production yield and the reliability of the semiconductor device by using a method for forming a tungsten film that both allows the tungsten film to have a low resistivity and does not cause a defect in the follow-up processes.

In one embodiment, a method for forming a tungsten film comprises the steps of forming a tungsten nucleation layer having at least one of an amorphous-phase and a β-phase over a semiconductor substrate; forming a first tungsten layer having a α-phase over the tungsten nucleation layer; and forming a second tungsten layer over the first tungsten layer by a physical vapor deposition process.

The tungsten nucleation layer can be formed in a chemical vapor deposition process or an atomic layer deposition process.

The tungsten nucleation layer is formed by flowing a B-containing gas as a reaction gas and flowing a W-containing gas as a source gas.

When the tungsten nucleation layer is formed the B-containing gas may include $B_2H_6$ gas and the W-containing gas may include $WF_6$ gas.

The tungsten nucleation layer may be formed in a stacked structure including a first nucleation layer and a second nucleation layer.

The first nucleation layer is formed by flowing a Si-containing gas as a reaction gas and flowing a W-containing gas as a source gas.

The first nucleation layer is formed by flowing $SiH_4$ gas as the reaction gas and flowing $WF_6$ gas as the source gas.

The first nucleation layer is formed by repeating a process including a flowing of a reaction gas, a first purge, a flowing of a source gas, and a second purge.

The second nucleation layer is formed by flowing a B-containing gas as a reaction gas and flowing a W-containing gas as a source gas.

When the second nucleation layer is formed the B-containing gas may include $B_2H_6$ gas and the W containing gas may include $WF_6$ gas.

The second nucleation layer is formed by repeating a process including a flowing of reaction gas, a first purge, a flowing of the source gas, and a second purge.

The second nucleation layer is formed by flowing a B-containing reaction gas alone onto a surface of the first nucleation layer.

Alternatively, the second nucleation layer may be formed by repeating a process including a flowing of a reaction gas of $B_2H_6$ and a purge.

The first tungsten layer is formed in a chemical vapor deposition process or an atomic layer deposition process.

The first tungsten layer is formed by flowing $WF_6$ gas and $H_2$ gas.

In another embodiment, a method for forming the wiring of a semiconductor device comprises the steps of forming a barrier film over a semiconductor substrate; forming a tungsten film over the barrier film; and etching the tungsten film and the barrier film to form the wiring, wherein the step of forming the tungsten film includes the steps of forming a tungsten nucleation layer having at least one of an amorphous-phase and a β-phase over the barrier film; forming a first tungsten layer having a α-phase over the tungsten nucleation layer; and forming a second tungsten layer over the first tungsten layer by a physical vapor deposition process.

Before the step of forming the barrier film, the method may further comprise forming a gate insulation film over the semiconductor substrate; and forming a polysilicon film over the gate insulation film.

The tungsten nucleation layer may be formed in a chemical vapor deposition process or an atomic layer deposition process.

The tungsten nucleation layer is formed by flowing a B-containing gas as a reaction gas and flowing a W-containing gas as a source gas.

When forming the tungsten nucleation layer the B-containing gas may be $B_2H_6$ gas and the W-containing gas may be $WF_6$ gas.

The tungsten nucleation layer may also be formed in a stacked structure of a first nucleation layer and a second nucleation layer.

The first nucleation layer is formed by flowing a Si-containing gas as a reaction gas and flowing a W-containing gas as a source gas.

When the first nucleation layer is formed the Si-containing gas may be $SiH_4$ gas and the W-containing gas may be $WF_6$ gas.

The first nucleation layer is formed by repeating a process including a flowing of the reaction gas, a first purge, a flowing of the source gas, and a second purge.

The second nucleation layer is formed by flowing a B-containing gas as a reaction gas and flowing a W-containing gas as a source gas.

When the second nucleation layer is formed the B-containing gas may be a $B_2H_6$ gas and the W-containing gas may be a $WF_6$ gas.

The second nucleation layer is formed by repeating a process including a flowing of reaction gas, a first purge, a flowing of the source gas, and a second purge.

Alternatively, the second nucleation layer can be formed by flowing only the B-containing reaction gas onto a surface of the first nucleation layer.

When forming the second nucleation layer in this manner a process including a flowing of a reaction gas of $B_2H_6$ and a purge is repeated.

The first tungsten layer is formed in a chemical vapor deposition process or an atomic layer deposition process.

The first tungsten layer is formed by flowing $WF_6$ gas and $H_2$ gas.

DESCRIPTION OF SPECIFIC EMBODIMENTS

In the present invention, a wiring tungsten film is formed in a stacked structure including a first tungsten layer formed using a low resistivity tungsten (LRW) deposition process and a second tungsten layer formed using a physical vapor deposition (PVD) process.

Herein, the tungsten film by the LRW deposition process (hereinafter, referred to as a low resistivity tungsten film) is formed by utilizing the difference in crystalline structures between a nucleation layer and a bulk tungsten layer. The bulk tungsten layer has a crystalline α-phase and is grown over the nucleation layer, which has an amorphous-phase or a β-phase; and thus, the tungsten film has a large grain size. This low resistivity tungsten film has considerably lower resistivity when compared to the tungsten film formed by the PVD process (hereinafter, referred to as a PVD tungsten film).

However, the low resistivity tungsten film has poor topology, which may in turn cause defects in subsequent processes, leading to poor exposure in a subsequent photolithography process.

Figure 1:
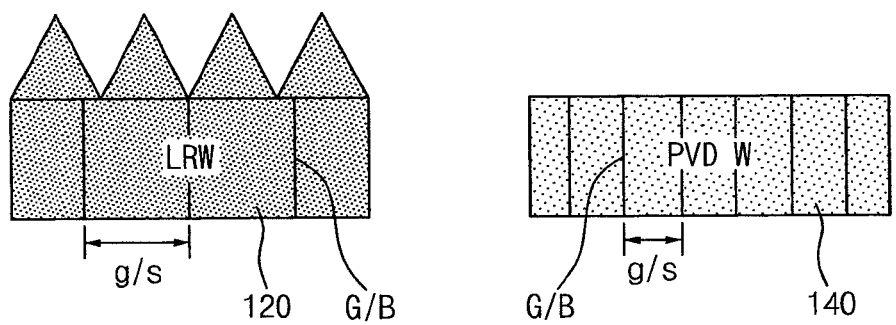
FIG. 1 is a cross-sectional view showing a low resistivity tungsten film and a physical vapor deposited (PVD) tungsten film.

FIG. 1 is a cross-sectional view illustrating the low resistivity tungsten film and the PVD tungsten film formed over an under film. A reference symbols g/s and G/B denote respectively a grain size and a grain boundary.

In FIG. 1, the low resistivity tungsten film 120 shown on the left has a longer grain size g/s but a poorer topology (i.e. a rougher surface) when compared to the PVD tungsten film 140 shown on the right. The poor topology of the low resistivity tungsten film 120 makes it difficult to form a gate with the low resistivity tungsten film 120 alone. For example, while the low resistivity tungsten film 120 has the advantage of low resistivity due to its long grain size g/s, it may cause a process problem due to the poor surface roughness.

Likewise, a gate with the PVD tungsten film 140 alone is not satisfactory. Although the PVD tungsten film 140 has good surface roughness and as such would not cause a defect in the follow-up processes, the PVD tungsten film 140 has high resistivity due to the short grain size g/s.

If the PVD tungsten film is formed over the low resistivity tungsten film (as is done in the present invention), the PVD tungsten film is formed by a matching growth with the low resistivity tungsten film. As a result, the PVD tungsten film formed by the matching growth has a grain size similar to that of the low resistivity tungsten film.

Accordingly, if the wiring tungsten film is formed in a stacked structure including a first tungsten layer using a LRW deposition process and a second tungsten layer using a PVD process, the first tungsten layer will have a large grain size, and the second tungsten layer will also have (like the first tungsten layer) a large grain size even though it is formed by the PVD process due to the second tungsten layer being formed by the matching growth.

Therefore, in the present invention, although the second tungsten layer is grown by the PVD process, the second tungsten layer can be formed with a large grain size using an under film (i.e. the first tungsten layer formed by the LRW deposition process). It is therefore possible to form a tungsten film with the entire tungsten film having a large grain size, and thus realize a wiring (i.e. a gate) having low resistivity.

Additionally, the wiring tungsten film (having the low resistivity tungsten film and the PVD tungsten film) of the present invention has a low surface roughness in relation to the formation of the bulk tungsten on its surface by the PVD process, and thus the wiring tungsten film does not cause defects in the follow-up processes. As a result, it is possible to enhance the production yield and the reliability of a semiconductor device.

In addition, the method for forming the tungsten film in accordance with the present invention can also be employed when forming a bit line, etc. As such, it is possible to greatly enhance the reliability and characteristics of a semiconductor device.

Hereinafter, a preferred embodiment of the present invention will be described with reference to the accompanying drawings.

Figure 2:
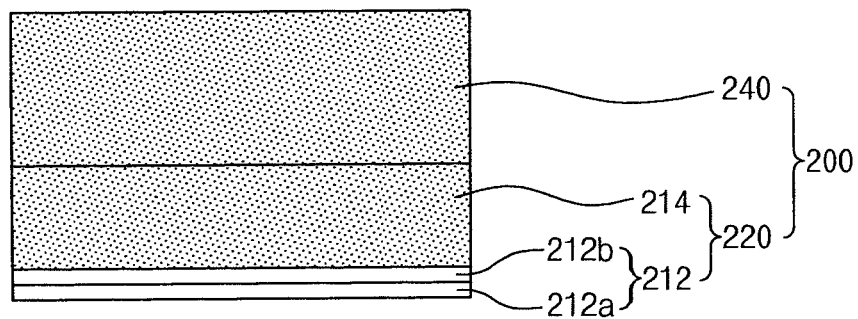
FIG. 2 is a cross-sectional view shown for illustrating a method for forming a tungsten film in accordance with an embodiment of the present invention.

FIG. 2 is a cross-sectional view illustrating a method for forming a tungsten film in accordance with an embodiment of the present invention.

As shown in FIG. 2, a tungsten film 200 is formed in a stacked structure including a low resistivity tungsten film 220 and a PVD tungsten film 240. The low resistivity tungsten film 220 is formed by growing a first tungsten layer 214 having an α-phase over a tungsten nucleation layer 212 having an amorphous-phase or a β-phase. The PVD tungsten film 240 is the second tungsten layer (which is formed by the PVD process), and it is formed by a matching growth over the first tungsten layer 214.

The tungsten nucleation layer 212 having an amorphous-phase or a β-phase is formed by a chemical vapor deposition (CVD) process or an atomic layer deposition (ALD) process (preferably an ALD process). Also, the tungsten nucleation layer 212 is formed in a stacked structure including a first nucleation layer 212a and a second nucleation layer 212b. The first nucleation layer 212a is formed by flowing a Si-containing gas as a reaction gas and flowing a W-containing gas as a source gas. For example, the first nucleation layer 212a may be formed by flowing $SiH_4$ gas as the reaction gas and flowing $WF_6$ gas as the source gas. Also, the first nucleation layer 212a is formed by alternating the flow of the reaction gas of $SiH_4$ and the source gas of $WF_6$ (i.e. the process of the flowing of the reaction gas, a purge, the flowing of the source gas, and purge), and repeating the process 1 to 10 times (preferably, repeating the process 3 to 4 times). The second nucleation layer 212b causes the entire nucleation layer to have the β-phase and is formed by flowing $B_2H_6$ gas as a reaction gas and flowing W-containing gas (e.g. $WF_6$ gas) as a source gas. Also, the second nucleation layer 212b is formed by alternating the flow of the reaction gas of $B_2H_6$ and the source gas of $WF_6$, i.e. repeating the process of flowing the reaction gas of $B_2H_6$, a purge, flowing the source gas of $WF_6$ and purge 3 to 10 times, and preferably repeating the process 4 to 6 times.

Also, in order to improve uniformity, it is possible to form the second nucleation layer 212b by flowing only the reaction gas of $B_2H_6$ onto the surface of the first nucleation layer 212a without flowing the source gas of $WF_6$. This is referred to as a soaking method, and the process includes the flowing of the reaction gas of $B_2H_6$ and purging. In the soaking method, the process is repeated 3 to 10 times, and preferably repeated 4 to 6 times.

Additionally, the tungsten nucleation layer 212 may be formed in a single layer structure instead of the stacked structure. In this case, the tungsten nucleation layer 212 is formed by flowing $B_2H_6$ gas as a reaction gas and flowing W-containing gas (e.g. $WF_6$ gas) as a source gas.

The first tungsten layer 214 is formed by flowing a source gas of $WF_6$ and a reaction gas of $H_2$ alternately or together according to a CVD process or an ALD process. Preferably, the first tungsten layer 214 is formed by a CVD process.

The PVD tungsten film 240 (i.e. the second tungsten layer which is formed by a PVD process) is formed by the matching growth over the first tungsten layer 214 of the low resistivity tungsten film 220. The PVD tungsten film 240 in accordance with an embodiment of the present invention is formed so as to have a larger grain size when compared to a tungsten film formed by a conventional PVD process. Herein, the grain size of the PVD tungsten film 240 is proportional to the number of nucleation layer deposition cycles carried out when forming the nucleation layer of the low resistivity film 220. The grain size increases as the number of nucleation layer deposition cycles increase, and the resistivity of the tungsten film 200 decreases as the grain size increases.

The following TABLE 1 shows a comparison of the resistivity, the roughness, and the grain size of a PVD tungsten film, a low resistivity tungsten film, and the stacked film including a low resistivity tungsten film and a PVD tungsten film in accordance with an embodiment of the present invention.

|  | PVD W | LRW | LRW + PVD W |
| --- | --- | --- | --- |
| Resistivity | 28.6 $\mu\Omega\text{-cm}^2$ | 14.7 $\mu\Omega\text{-cm}^2$ | 17.7 $\mu\Omega\text{-cm}^2$ |
| RMS (Roughness) | 0.864 nm | 5.419 nm | 1.307 nm |
| Grain size | small | large | large |

As shown in TABLE 1, the stacked film of a low resistivity tungsten film and a PVD tungsten film in accordance with an embodiment of the present invention has low surface resistance (Rs) and resistivity similar to those of the low resistivity tungsten film. As previously described, this is due to the stacked film having a large grain size, and a surface roughness that is considerably lower than that of the low resistivity tungsten film.

Figure 3:
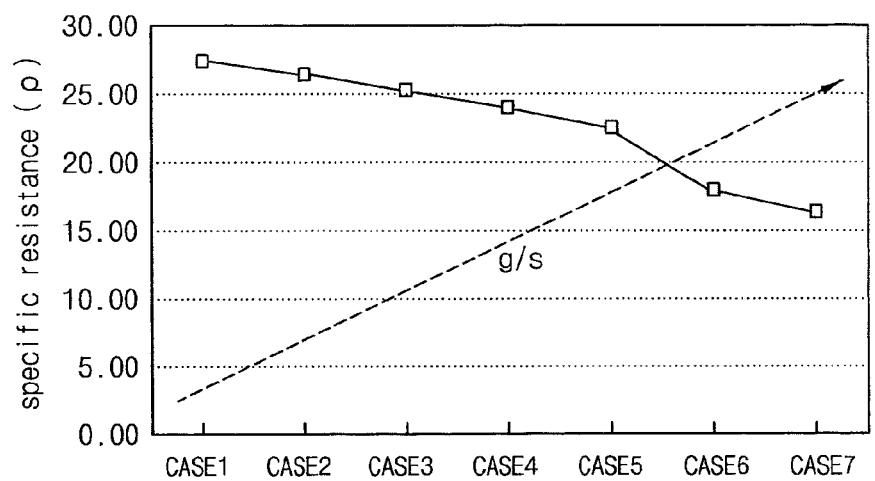
FIG. 3 is a graph illustrating the resistivity of the PVD tungsten film according to the grain size in the method for forming a tungsten film in accordance with an embodiment of the present invention.

Therefore, the stacked film of a low resistivity tungsten film and a PVD tungsten film in accordance with an embodiment of the present invention has low resistivity and surface roughness, making it possible to realize a low resistivity wiring as well as prevent process defects to enhance the production yield and the reliability of a semiconductor device FIG. 3 is a graph illustrating the resistivity of the PVD tungsten film according to the grain size in the method for forming a tungsten film in accordance with an embodiment of the present invention. In each of the cases 1 through 7 shown in FIG. 3, the number of deposition cycles for forming the first nucleation layer is four, and the process of soaking for forming the second nucleation layer is carried out zero to six times respectively.

When referring to FIG. 3, in can be appreciated that the grain size (g/s—the dotted line) of the tungsten film increases as the number of the soaking cycles increases in a state where the first nucleation layer deposition cycle is carried out four times, and the resistivity (ρ—the solid line) of the tungsten film decreases as the grain size increases.

Accordingly, it can be interpreted from FIG. 3 that the grain size of the tungsten film increases as the deposition cycle for forming the first and second nucleation layers (particularly the deposition cycle for forming the second nucleation layer) is carried out more times, and it can also be interpreted that the PVD tungsten film formed over the low resistivity tungsten film also has had a large grain size due to the matching growth.

Therefore, in the present invention, by forming the PVD tungsten film over the low resistivity tungsten film, it is possible to enlarge the grain size of the entire tungsten film and thus form a wiring tungsten film having a low resistivity.

Figure 4:
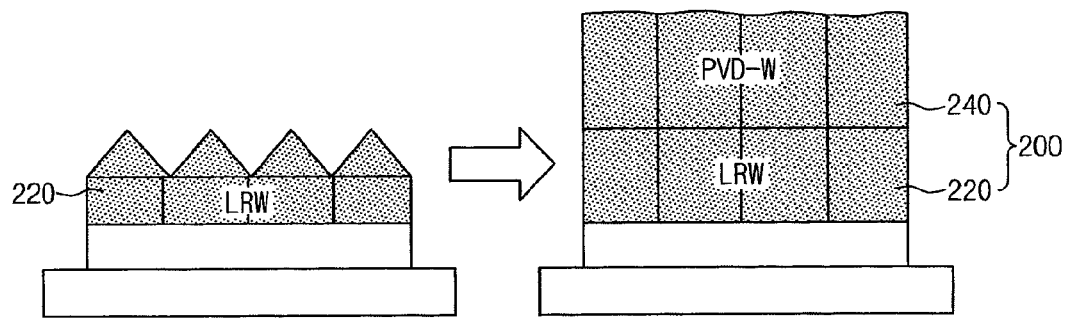
FIG. 4 is a cross-sectional view showing the PVD tungsten film formed over the low resistivity tungsten film in the method for forming a tungsten film in accordance with an embodiment of the present invention.

FIG. 4 is a cross-sectional view showing the PVD tungsten film formed over the low resistivity tungsten film in the method for forming a tungsten film in accordance with an embodiment of the present invention.

At first, the low resistivity tungsten film 220 has very poor topology, i.e. high surface roughness as shown in the left drawing in FIG. 4. This poor topology increases sharply as the thickness of the film increases. However, if the PVD tungsten film 240 is formed over the thin low resistivity tungsten film 220, as shown in the right drawing of FIG. 4, the PVD tungsten film 240 is formed with good surface roughness; and as a result, the surface of the entire tungsten film 200 has a low surface roughness, i.e. good topology.

Therefore, the tungsten film 200 formed in accordance with an embodiment of the present invention has good surface roughness, and thus does not cause defects in the follow-up processes. As such, in the present invention, it is possible to enhance the production yield and reliability of a semiconductor device.

FIGS. 5A through 5D are cross-sectional views shown for illustrating the process steps of a method for manufacturing the wiring of a semiconductor device using the above described method for forming a tungsten film.

Figure 5A:
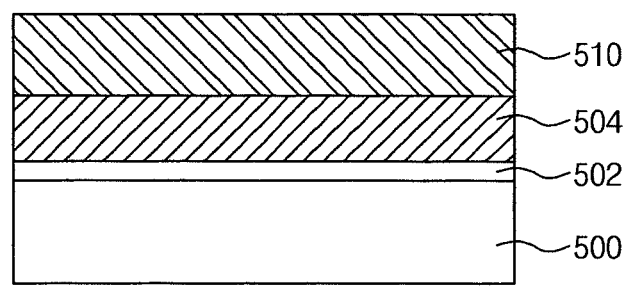
FIGS. 5A through 5D are cross-sectional views shown for illustrating the process steps of a method for manufacturing the wiring of a semiconductor device in accordance with an embodiment of the present invention.

Referring to FIG. 5A, a gate insulation film 502 is formed over a semiconductor substrate 500. The gate insulation film 502 is formed of one of: a silicon oxide film ($SiO_2$), a silicon nitride film (SiN), a silicon oxynitride film (SiON), and a metal oxide film ($M_xO_y$) with high dielectric constant, or a stacked film thereof. For example, the gate insulation film 502 is formed of a silicon oxynitride film (SiON). A polysilicon film 504 doped with p-type impurities is formed over the gate insulation film 502. A barrier film 510 is then formed over the polysilicon film 504. The barrier film 510 is formed in one of a stacked structure of a titanium film and a tungsten nitride film (Ti/WN); a stacked structure of a titanium nitride film, a titanium film, and a tungsten nitride film (Ti/TiN/WN); and a stacked structure of a titanium film, a tungsten nitride film, and a titanium nitride film (Ti/WN/TiN).

Figure 5B:
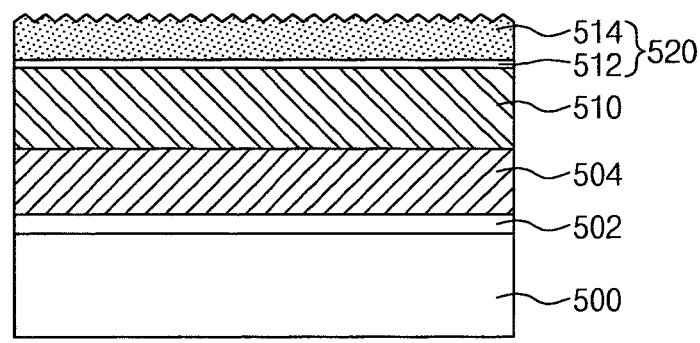

Referring to FIG. 5B, a tungsten nucleation layer 512 having an amorphous-phase or a β-phase is formed over the barrier film 510 by a CVD process or an ALD process (preferably by the ALD process), and then a first tungsten layer 514 having a crystalline α-phase is formed over the tungsten nucleation layer 512 by a CVD process or an ALD process to form a low resistivity tungsten film 520.

The tungsten nucleation layer 512, though not shown in detail, is formed in a stacked structure of a first nucleation layer, which is formed by flowing $SiH_4$ gas as a reaction gas and flowing $WF_6$ gas as a source gas, and a second nucleation layer, which is formed by flowing $B_2H_6$ gas as a reaction gas and flowing $WF_6$ gas as a source gas. The first nucleation layer is formed by alternating the flowing of the reaction gas and the flowing of the source gas, i.e. a process including flowing the reaction gas, a purge, flowing the source gas and purge is repeated 1 to 10 times, and preferably repeated 3 to 4 times. The second nucleation layer is formed by repeating the process of alternating the flow of the reaction gas and the source gas 3 to 10 times, and preferably 4 to 6 times. Alternatively, it may be possible to form the tungsten nucleation layer 512 in a stacked structure including a first nucleation layer formed by flowing $SiH_4$ gas as a reaction gas and flowing $WF_6$ gas as a source gas, and a second nucleation layer formed by soaking the reaction gas of $B_2H_6$ alone. In this case, a process including the flowing of a reaction gas of $B_2H_6$ and a purge is repeated 3 to 10 times, and preferably repeated 4 to 6 times.

The tungsten nucleation layer 512 may also be formed in a single layer structure. In this case, the tungsten nucleation layer 512 is formed by flowing a $B_2H_6$ gas as a reaction gas and flowing a $WF_6$ gas as a source gas and alternating the flow of the reaction gas and the source gas, i.e. a process including flowing the reaction gas, a purge, flowing the source gas and purge is repeated 1 to 10 times, and preferably repeated 3 to 4 times.

Also, although the above described method of forming the tungsten nucleation layer 512 by alternately flowing the reaction gas of $SiH_4$ or $B_2H_6$ and the source gas of $WF_6$ is according to an ALD method, it is also possible to form the tungsten nucleation layer 512 by a CVD method of simultaneously injecting the gases.

The first tungsten layer 514 is formed by flowing $WF_6$ gas as a source gas and $H_2$ gas as a reaction gas according to a CVD process or an ALD process (preferably a CVD process). As shown in FIG. 5B, at this time the first tungsten layer 514 in the low resistivity tungsten film 520 has poor surface roughness.

Figure 5C:
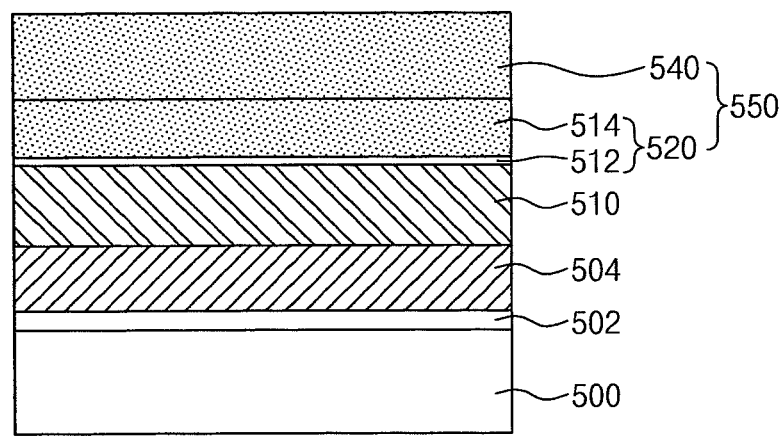

Referring to FIG. 5C, a second tungsten layer 540 is formed over the low resistivity tungsten film 520 (which includes the stacked structure of the tungsten nucleation layer 512 and the first tungsten layer 514) by a PVD process to form a wiring tungsten film 550 formed of a stacked structure of the low resistivity tungsten film 520 and the second tungsten layer 540.

Herein, the second tungsten layer 540 is formed so as to have a large grain size (unlike a bulk tungsten film formed by a conventional PVD process) since the second tungsten layer 540 is formed by the matching growth over the first tungsten layer 514 of the low resistivity tungsten film 520. Therefore, the entire tungsten film 550 formed of a stacked structure of the low resistivity tungsten film 520 and the PVD tungsten film (i.e. the second tungsten layer 540 by a PVD process) has a large grain size and thus low resistivity.

Additionally, in the present invention, the second tungsten layer 540 if formed by a PVD process; and, as previously stated, a bulk tungsten film formed by a conventional PVD process has good surface roughness. As such, the tungsten film 550 of the present invention also has good surface roughness. Therefore, the tungsten film 550 of the present invention does not cause defects in the follow-up processes due to its good surface roughness.

Figure 5D:
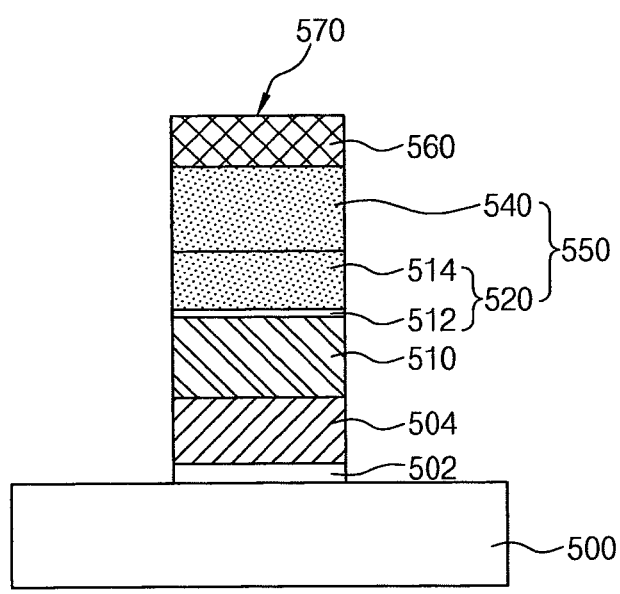

Referring to FIG. 5D, a hard mask for defining a gate forming area is formed over the tungsten film 550. The tungsten film 550, the barrier film 510, the polysilicon film 504 doped with p-type impurities, and the gate insulation film 502 are etched using the hard mask 560 as an etching mask to form a wiring, i.e. a tungsten gate 570.

Herein, since the tungsten film 550 has good surface roughness, it does not cause process defects, e.g. poor exposure in the follow-up processes. Accordingly, the tungsten gate of the present invention can be formed in a stable manner, and therefore ensures device characteristics and reliability.

The above description employs the method of forming the tungsten film of the present invention in the formation of a gate, but the present invention may also be applied to the formation of a bit line and the formation of a metal wiring. In these cases the reliability and characteristics of a semiconductor device are further enhanced.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A method for forming a tungsten film, comprising the steps of:
   forming a tungsten nucleation layer having at least one of an amorphous-phase and a β-phase over a semiconductor substrate;
   forming a first tungsten layer having a α-phase by a chemical vapor deposition process on the tungsten nucleation layer, the first tungsten layer having a first grain size; and
   forming a second tungsten layer on the first tungsten layer by a physical vapor deposition process, the second tungsten layer having a second grain size matched to the first grain size,
   wherein the step of forming the tungsten nucleation layer includes flowing a B-containing gas as a reaction gas and flowing a W-containing gas as a source gas.

2. The method according to claim 1, wherein the tungsten nucleation layer is formed by a chemical vapor deposition process or an atomic layer deposition process.

3. The method according to claim 1, wherein the B-containing gas includes $B_2H_6$ gas and the W-containing gas includes $WF_6$ gas.

4. The method according to claim 1, wherein the first tungsten layer is formed by flowing $WF_6$ gas and $H_2$ gas.

5. A method for forming a tungsten film, comprising the steps of:
   forming a tungsten nucleation layer having at least one of an amorphous-phase and a β-phase over a semiconductor substrate;
   forming a first tungsten layer having a α-phase by a chemical vapor deposition process on the tungsten nucleation layer, the first tungsten layer having a first grain size; and
   forming a second tungsten layer on the first tungsten layer by a physical vapor deposition process, the second tungsten layer having a second grain size matched to the first grain size,
   wherein the step of forming the tungsten nucleation layer comprises the steps of:
   forming a first nucleation layer over the semiconductor substrate; and
   forming a second nucleation layer on the first nucleation layer by flowing a B-containing gas as a reaction gas.

6. The method according to claim 5, wherein the step of forming the first nucleation layer includes flowing a Si-containing gas as a reaction gas and flowing a W-containing gas as a source gas.

7. The method according to claim 6, wherein the Si-containing gas includes $SiH_4$ gas and the W-containing gas includes $WF_6$ gas.

8. The method according to claim 5, wherein the first nucleation layer is formed by flowing $SiH_4$ as a reaction gas, conducting a first purge, flowing $WF_6$ gas as a source gas, and conducting a second purge, repeatedly.

9. The method according to claim 5, wherein the step of forming the second nucleation layer includes flowing the B-containing gas as a reaction gas and flowing a W-containing gas as a source gas.

10. The method according to claim 9, wherein the B-containing gas includes $B_2H_6$ gas and the W-containing gas includes $WF_6$ gas.

11. The method according to claim 5, wherein the step of forming the second nucleation layer includes repeating a process including a flowing of the B2H6 gas as a reaction gas, a first purge, flowing of WF6 gas as a source gas, and a second purge.

12. The method according to claim 5, wherein the step of forming the second nucleation layer includes repeating a process including a flowing of the B-containing reaction gas as a reaction gas and a purge, wherein the B-containing reaction gas includes B2H6.

13. The method according to claim 5, wherein the first tungsten layer is formed by flowing WF6 gas and H2 gas.

* * * * *